(12) United States Patent
Wu

(10) Patent No.: US 7,106,109 B2
(45) Date of Patent: Sep. 12, 2006

(54) BIASING CIRCUIT AND VOLTAGE CONTROL OSCILLATOR THEREOF

(75) Inventor: Li-Te Wu, Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 11/162,654

(22) Filed: Sep. 19, 2005

(65) Prior Publication Data

US 2006/0022744 A1  Feb. 2, 2006

Related U.S. Application Data

(63) Continuation-in-part of application No. 10/711,668, filed on Sep. 30, 2004, now abandoned.

(30) Foreign Application Priority Data

Jul. 16, 2004  (TW) ............................. 93121259 A

(51) Int. Cl.
*H03C 3/00* (2006.01)

(52) U.S. Cl. ...................................................... 327/101
(58) Field of Classification Search ................ 327/101, 327/147, 149, 156, 158, 276, 280, 287, 530, 327/534, 535, 538, 543
See application file for complete search history.

(56) References Cited

U.S. PATENT DOCUMENTS 5,955,929 A * 9/1999 Moon et al. ................... 331/57
6,686,788 B1 * 2/2004 Kim et al. ..................... 327/280

* cited by examiner

*Primary Examiner*—Jeffrey Zweizig
(74) *Attorney, Agent, or Firm*—Jianq Chyun IP Office

(57) ABSTRACT

A biasing circuit and a voltage control oscillator thereof are provided. The biasing circuit comprises a compensation circuit, a delay circuit and a comparison circuit. In the biasing circuit, the compensation circuit compensates a first differential voltage that is generated by the delay circuit so as to stabilize an output of the biasing circuit operated by a low-current or low-frequency. The jitter of the clock frequency that the voltage control oscillator output can be reduced.

18 Claims, 12 Drawing Sheets

BIASING CIRCUIT AND VOLTAGE CONTROL OSCILLATOR THEREOF

CROSS-REFERENCE TO RELATED APPLICATION

This application is a continuation-in-part of a prior application Ser. No. 10/711,668 filed on Sep. 30, 2004, which is now abandoned and claims the priority benefit of Taiwan application serial no. 93121259, filed on Jul. 16, 2004. This application was filed while the parent application was pending. All disclosures are incorporated herewith by reference.

BACKGROUND OF INVENTION

1. Field of the Invention

The present invention relates to a biasing circuit, and more particularly to a biasing circuit with a compensation circuit for stabilizing the output thereof.

2. Description of Related Art

Phase Lock Loop (PLL) has been widely used in the design of integrated circuits, especially in frequency combination, clock feedback and data feedback. The key element in the PLL is Voltage Control Oscillator (VCO) and the VCO directly affects the performance of the PLL.

FIG. 5 is a circuit block diagram showing a prior art VCO. Referring to FIG. 5, the VCO 500 comprises a replica biasing circuit 502, a voltage/current converter 504, a ring oscillator 508, a differential circuit 510 and a reference voltage generating circuit 532.

FIG. 6 is a schematic drawing showing a prior art VCO. The biasing circuit 502 comprises a comparison circuit 516 and a delay circuit 514. The delay circuit 514 comprises a variable current source 522, a first transistor M51, a first resistor circuit 524, a second transistor M52 and a second resistor circuit 526. The variable current source 522 receives the input current and an operational voltage, and outputs a variable current from a current output terminal of the variable current source 522. The first transistor M51 comprises a drain terminal, a source terminal and a gate terminal, wherein the source terminal is coupled to the current output terminal of the variable current source 522, the gate terminal is grounded and the drain terminal is coupled to the first resistor circuit 524. The first resistor circuit 524 comprises a first terminal, a second terminal and a third terminal, wherein the second terminal is grounded and the third terminal is coupled to the output terminal of the comparison circuit 516. The resistance of the first resistor circuit 524 varies with the comparison signal.

The second transistor M52 comprises a source terminal, a drain terminal and a gate terminal, wherein the source terminal is coupled to the current output terminal of the variable current source 522 and the gate terminal is coupled to the third input terminal of the delay circuit 544, i.e. the reference voltage. The second resistor circuit 526 comprises a first terminal, a second terminal and a third terminal, wherein the first terminal is coupled to the drain terminal of the second transistor M52, the second terminal is grounded and the third terminal is coupled to the output terminal of the comparison circuit 516. The resistance of the first resistor circuit 126 varies with the comparison signal.

The first output terminal of the delay circuit 514 is disposed between the first transistor M51 and the first resistor circuit 524, and the second output terminal of the delay circuit 514 is disposed between the second transistor M52 and the second resistor circuit 526.

In the prior art technology, the voltage/current converter 504 receives and converts the input voltage into an input current. The voltage/current converter 504 outputs the input current to the replica biasing circuit 502 and the ring oscillator 508. The delay circuit 514 generates the first differential voltage according to the reference voltage output from the reference voltage generating circuit 532 and the current provided by the variable current source 522. The comparison circuit 516 outputs the comparison signal to the first resistor circuit 524 and the second resistor circuit 526 according to the reference voltage and the first differential voltage. The comparison signal from the comparison circuit 516 is also fed to the ring oscillator 508. The ring oscillator 508 and the differential circuit 510 output the clock signal according to the input current and the comparison signal from the comparison circuit 516.

FIGS. 7A and 7B are small-signal analysis curves of the prior art replica biasing circuit. The DC gain is equal to 71.36 dB. The whole frequency bandwidth of the gain is about 4.06 MHz, and the phase margin is about 37 degrees. The first-port frequency is about 2.06 kHz, and the second-port frequency is about 2.83 MHz.

FIGS. 7A and 7B show the voltage-gain/frequency curves of the prior art PLL. FIG. 7A represents the input voltage curve at the input terminal of the voltage control oscillator 500. FIG. 7B represents the output at the port 523 of the replica biasing voltage 514. According to the curve in FIG. 7B, when the variable current source 522 provides small currents, an output jitter at port 523 is generated. In addition, FIG. 8A is a conventional input voltage curve of a voltage control oscillator. FIG. 8B is a conventional replica biasing circuit output voltage curve.

Accordingly, as the replica biasing circuit 514 cannot stabilize the output thereof under low-current or low-frequency operations, the output jitter of the voltage control oscillator 500 occurs.

SUMMARY OF THE INVENTION

Accordingly, the present invention is directed to a biasing circuit comprising a compensation circuit capable of stabilizing the output current regardless of high or low output currents from the biasing circuit.

The present invention is also directed to a voltage control oscillator. By using a compensation circuit in the biasing circuit, the jitter of the clock frequency output from the voltage control oscillator can be suppressed.

The present invention discloses a biasing circuit for receiving the input current and the reference voltage. The biasing circuit comprises a delay circuit, a compensation circuit and a comparison circuit. The delay circuit comprises a first input terminal, a second input terminal, a third input terminal and a fourth input terminal, and a first output terminal, wherein the first input terminal receives the input current, the second input terminal is grounded and the third input terminal receives the reference voltage. The compensation circuit is coupled to the first output terminal of the delay circuit and outputs a compensation voltage according to a first differential voltage at the first output terminal of the delay circuit. The comparison circuit comprises a first input terminal, a second input terminal and an output terminal, wherein the first input terminal is coupled between the compensation circuit and the first output terminal of the delay circuit so as to receive the compensation voltage and the second input terminal receives the reference voltage. The comparison circuit is adapted for comparing the compensation voltage and the reference voltage to output a comparison signal from the output terminal of the comparison circuit to the fourth input terminal of the delay circuit and also serving as an output signal for use in next circuit block.

According to an embodiment of the present invention, the compensation circuit comprises a constant current source and a voltage detecting circuit. The constant current source comprises a first terminal and a second terminal, wherein the second terminal outputs a constant current. The voltage detecting circuit is coupled to the second terminal of the constant current source and generates the compensation voltage according to the constant current. The first output terminal of the delay circuit is coupled to a node between the constant current source and the voltage detecting circuit.

The present invention also discloses a voltage control oscillator for receiving an input current and a reference voltage. The voltage control oscillator comprises a voltage/current converter, a biasing circuit and an oscillation circuit. The voltage/current converter receives and converts the input voltage into an input current. The voltage/current converter outputs the input current. The biasing circuit comprises a delay circuit, a compensation circuit and a comparison circuit. The delay circuit outputs a first differential voltage, according to the input current and the reference voltage. The oscillation circuit is coupled to the voltage/current converter for receiving the input current and coupled to the biasing circuit for receiving a comparison signal, and outputting a clock signal according thereto.

The present invention also discloses an electronic device comprising at least one biasing circuit. The biasing circuit comprises a delay circuit, a compensation circuit and a comparison circuit. The delay circuit comprises a first input terminal, a second input terminal, a third input terminal and a fourth input terminal, and a first output terminal, wherein the first input terminal receives the input current, the second input terminal is grounded and the third input terminal receives the reference voltage. The compensation circuit is coupled to the first output terminal of the delay circuit and outputs a compensation voltage according to a first differential voltage at the first output terminal of the delay circuit. The comparison circuit comprises a first input terminal, a second input terminal and an output terminal. The first input terminal of the comparison circuit is coupled to a node between the compensation circuit and the first output terminal of the delay circuit so as to receive the compensation voltage. The second input terminal of the comparison circuit receives the reference voltage. The comparison circuit compares the compensation voltage and the reference voltage so as to output a comparison signal from the output terminal of the comparison circuit to the fourth input terminal of the delay circuit and also serving as an output signal for use in next circuit block. The delay circuit outputs the first differential voltage from the first output terminal of the delay circuit according to the input current and the comparison signal.

The present invention discloses another electronic device comprising at least one voltage control oscillator. The voltage control oscillator circuit receives an input voltage and a reference voltage. The voltage control oscillator comprises a voltage/current converter, a biasing circuit and an oscillation circuit. The voltage/current converter outputs the input current. The biasing circuit comprises a delay circuit, a compensation circuit and a comparison circuit. The biasing circuit outputs a first differential voltage according to the input current and the reference voltage. The oscillation circuit is coupled to the voltage/current converter and the biasing circuit for receiving the input current, the output signal of the biasing circuit and outputs a clock signal according to the input current and the first differential voltage.

According to an embodiment of the present invention, the compensation circuit disposed in the biasing circuit. When the biasing circuit is operating under small current or small frequency, the biasing circuit suppresses the jitter of the output clock frequency of the voltage control oscillator.

The above and other features of the present invention will be better understood from the following detailed description of the preferred embodiments of the invention that is provided in communication with the accompanying drawings.

DESCRIPTION OF EMBODIMENTS

Figure 1:
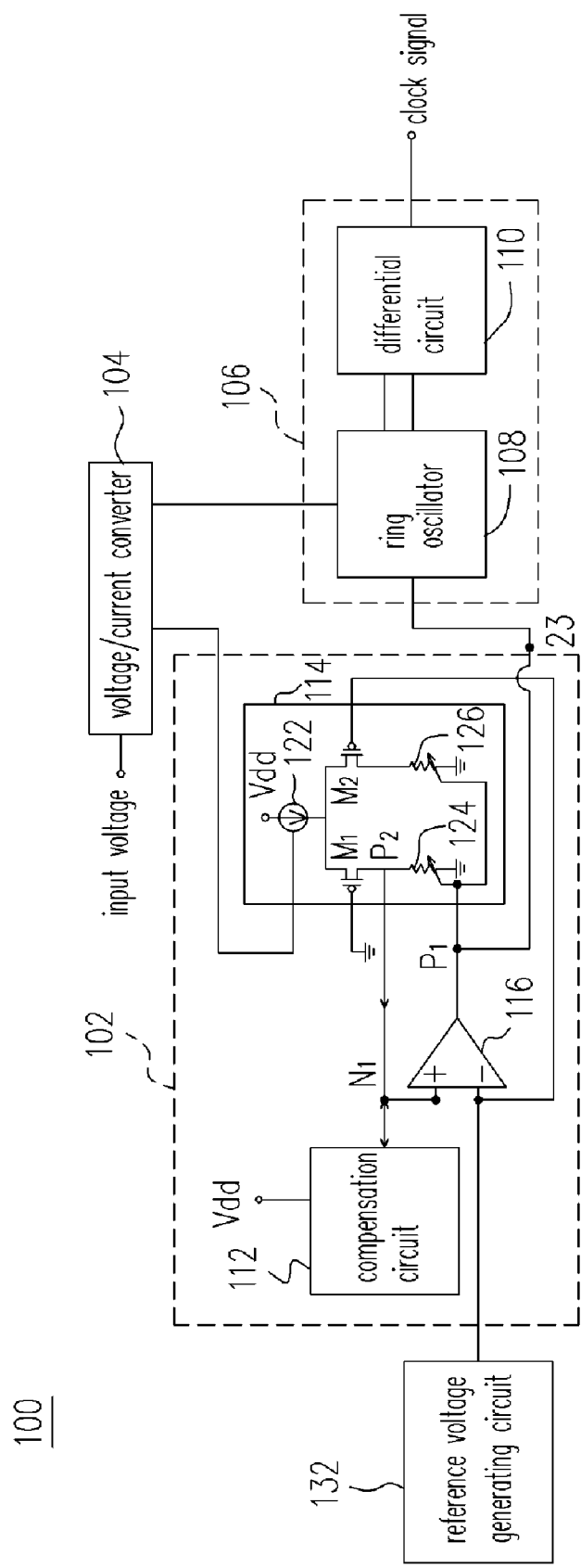
FIG. 1 is a circuit block diagram showing a voltage control oscillator according to an embodiment of the present invention.

FIG. 1 is a circuit block diagram showing a voltage control oscillator according to an embodiment of the present invention. The voltage control oscillator 100 comprises a biasing circuit 102, a voltage/current converter 104, an oscillation circuit 106 and a reference voltage generating circuit 132. One of ordinary skill in the art will understand that the biasing circuit 102 can be, for example, a replica biasing circuit, but not limited thereto.

In this embodiment, the voltage/current converter 104 receives and converts the input voltage into an input current. The voltage/current converter 104 outputs the input current to the biasing circuit 102 and the oscillation circuit 106. The biasing circuit 102 is coupled to the voltage/current converter 104, having a delay circuit 114, a compensation circuit 112 and a comparison circuit 116. The delay circuit 114 comprises a first input terminal, a second input terminal, a third input terminal and a fourth input terminal, and a first output terminal, wherein the first input terminal receives the input current, the second input terminal is grounded and the third input terminal of the delay circuit 114 receives the reference voltage output from the reference voltage generating circuit 132.

Figure 2:
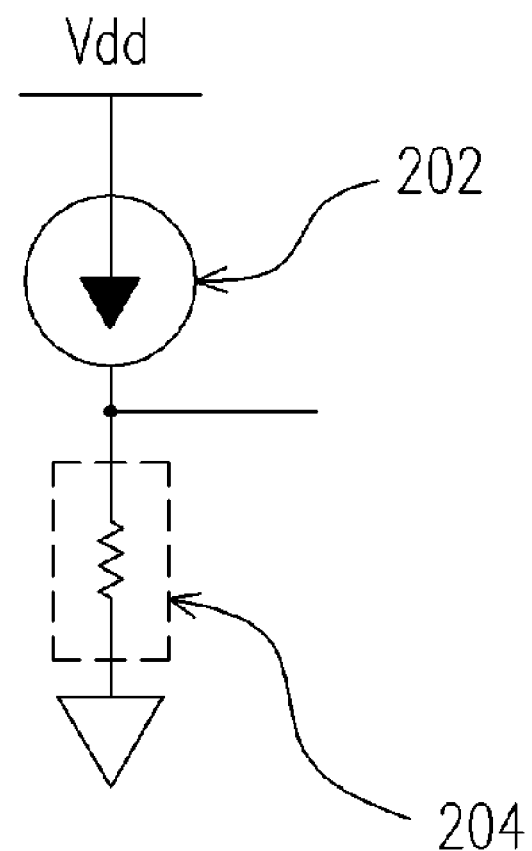
FIG. 2 is a schematic drawing showing a compensation circuit according to an embodiment of the present invention.

The compensation circuit 112 is coupled to the first output terminal of the delay circuit 114 and outputs a compensation voltage according to a first differential voltage at the first output terminal of the delay circuit 114. FIG. 2 is a schematic drawing showing a compensation circuit according to an embodiment of the present invention. Referring to FIG. 2, the compensation circuit 112 may comprise, for example, the constant current source 202 and the voltage detecting circuit 204. The constant current source 202 comprises a first terminal and a second terminal, wherein the second terminal outputs a constant current to the voltage detecting circuit 204. The voltage detecting circuit 204 generates the compensation voltage according to the constant current. The first output terminal of the delay circuit 114 is coupled to a node between the constant current source 202 and the voltage detecting circuit 204.

The voltage detecting circuit 204 can be, for example, a resistor, but not limited thereto.

Referring to FIG. 1, the comparison circuit 116 comprises a first input terminal, a second input terminal and an output terminal, wherein the first input terminal is coupled to a node between the compensation circuit 112 and the first output terminal of the delay circuit 114 so as to receive the compensation voltage and the second input terminal receives the reference voltage. The comparison circuit 116 compares the compensation voltage and the reference voltage to output a comparison signal from the output terminal of the comparison circuit 116 to the fourth input terminal of the delay circuit 114. The comparison signal from the comparison circuit 116 is also fed to the oscillation circuit 106, in which the oscillation circuit 106 also receives the input current from the voltage/current converter 104.

In the present embodiment, the oscillation circuit 106 is coupled to the voltage/current converter 104 and the biasing circuit 102 for receiving the input current, the first differential voltages, and outputting a clock signal according thereto.

In the present embodiment, the delay circuit 114 comprises a variable current source 122, a first transistor M1, a first resistor circuit 124, a second transistor M2 and a second resistor circuit 126. The variable current source 122 receives the input current and an operational voltage. The variable current source 122 outputs a variable current from a current output terminal of the variable current source 122. The first transistor M1 comprises a drain terminal, a source terminal and a gate terminal, wherein the source terminal is coupled to the current output terminal of the variable current source 122 and the gate terminal is grounded. The drain terminal of the first transistor M1 is coupled to the first resistor circuit 124. The first resistor circuit 124 comprises a first terminal, a second terminal and a third terminal. The second terminal of the first resistor circuit 124 is grounded, and the third terminal of the first resistor circuit 124 is coupled to the output terminal of the comparison circuit 116. The resistance of the first resistor circuit 124 varies with the comparison signal.

In this embodiment, the second transistor M2 comprises a source terminal, a drain terminal and a gate terminal, wherein the source terminal is coupled to the current output terminal of the variable current source 122 and the gate terminal is coupled to the third input terminal of the delay circuit 114, i.e. the reference voltage. The second resistor circuit 126 comprises a first terminal, a second terminal and a third terminal, wherein the first terminal is coupled to the drain terminal of the second transistor M2, the second terminal is grounded and the third terminal is coupled to the output terminal of the comparison circuit 116. The resistance of the first resistor circuit 126 varies with the comparison signal.

The first output terminal of the delay circuit 114 is disposed between the first transistor M1 and the first resistor circuit 124, and the second output terminal of the delay circuit 114 is disposed between the second transistor M2 and the second resistor circuit 126. Here, the second output terminal of the delay circuit 114 in this example is not necessary to be used.

In the present embodiment, the first resistor circuit 124 may comprise, for example, one or more transistors. The second resistor circuit 126 may also comprise, for example, one or more transistors. The present invention, however, is not limited thereto.

In the present embodiment, the oscillation circuit 106 may comprise, for example, a ring oscillator 108 and a differential circuit 110. The ring oscillator 108 may receive the comparison signal from the comparison circuit 116 and the input current. The ring oscillation circuit 108 may comprise a plurality of delay circuits. But the invention is not limited thereto.

In the present embodiment, the reference voltage can be generated, for example, by a reference voltage generating circuit 132.

Referring to FIGS. 1 and 2, the voltage control oscillator 100 converts the input voltage into an input current and outputs the input current to the delay circuit 114 and the ring oscillator 106. The delay circuit 114 provides currents to the first transistor M1 and the second transistor M2. A first differential voltage is at the first output terminal, P2, of the delay circuit 114. The compensation circuit 112 outputs the compensation voltage to the first input terminal of the comparison circuit 116 according to the first differential voltage at P2.

The comparison circuit 116 compares the reference voltage and the compensation voltage and outputs the comparison signal to the first resistor circuit 124 and the second resistor circuit 126. The comparison signal from the comparison circuit 116 and the input current from the voltage/current converter 104 are fed to the oscillation circuit 106, and the oscillation circuit 106 outputs the clock signal.

In the present embodiment, a small-signal ac analysis method is used to analyze the output stability of the biasing circuit. A two-port model, P1 and P2, is used to analyze the replica biasing circuit. If the high-level port is disregarded, the capacitance is C23, the output impedance of the operational amplifier is rop at the first port P1, and the port frequency $\omega_1=1/r_{op}C_{23}$. The second port P2 relates to the feedback port N1 and the port frequency $\omega_2=1/R_2C_{N1}$, wherein is the capacitance at the port N1. The equivalent resistance $R_2$ is $(r_{122}+r_{M1})\|r_{124}\|R_{204}\|r_{202}$. Because the output impedances of variable current source 122 and the constant current source 141 are higher than the others, the equivalent resistance $R_2$ becomes $r_{124}\|R_{204}$.

In the present embodiment, the voltage detecting circuit 204 controls the equivalent impedance at the second port. Accordingly, the maximum impedance $R_{2max}$ at the second port P2 is substantially equivalent to the impedance $R_{204}$. The minimum frequency $\omega_2$ at the second port P2 is fixed as $1/R_{204}C_{31}$. The compensation resistor 204 affects the dc biasing port. The affection can be removed by using the constant current source 202 in the compensation circuit 112. The constant current output from the constant current source 202 is equivalent to reference voltage/$R_{204}$.

FIGS. 3A–3B and 4A–4B are a small-signal analysis curve of a compensation circuit, an input voltage curve of a voltage control oscillator, a first differential voltage curve and an output voltage curve in the biasing circuit according to an embodiment of the present invention.

Figure 3A:
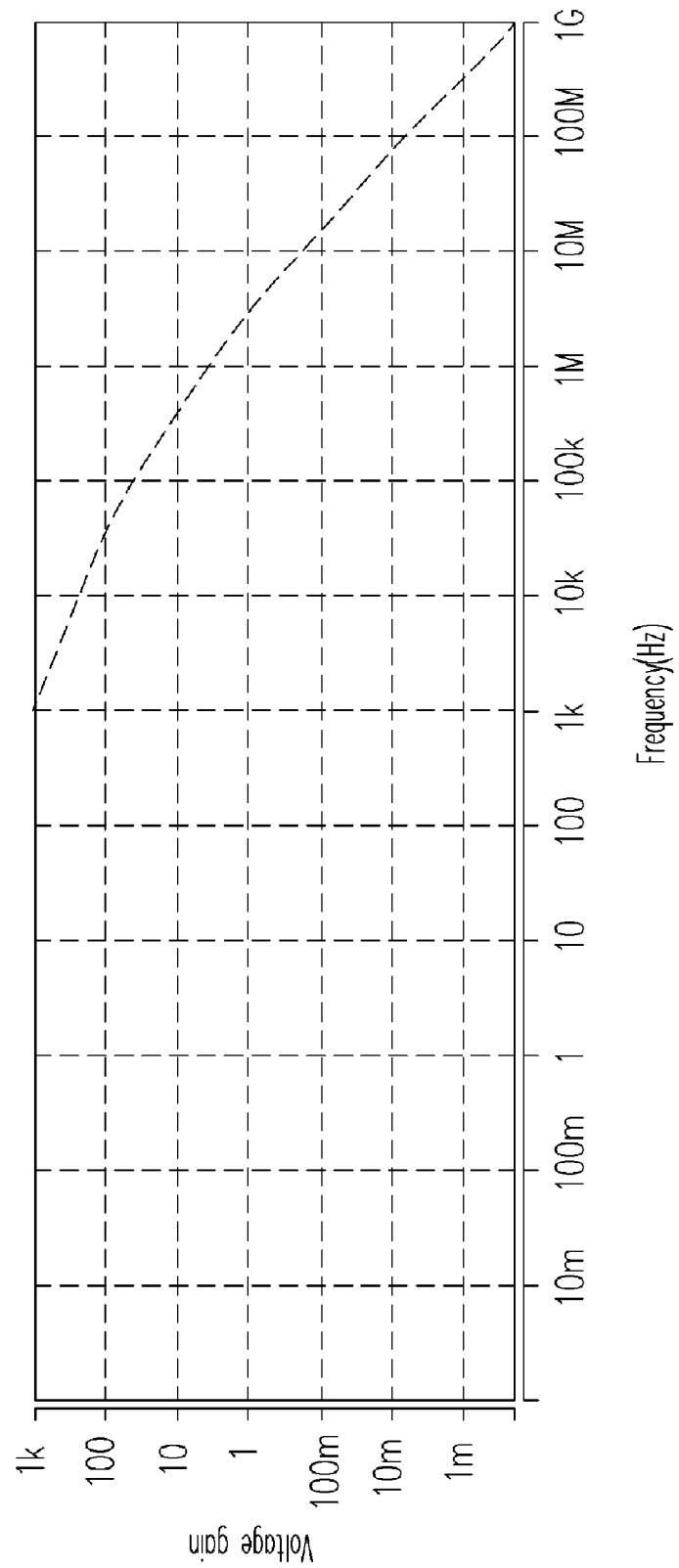
FIGS. 3A–3B and 4A–4B are a small-signal analysis curve of a compensation circuit, an input voltage curve of a voltage control oscillator, a first differential voltage curve and an output voltage curve of the biasing circuit, according to an embodiment of the present invention.
Figure 3B:
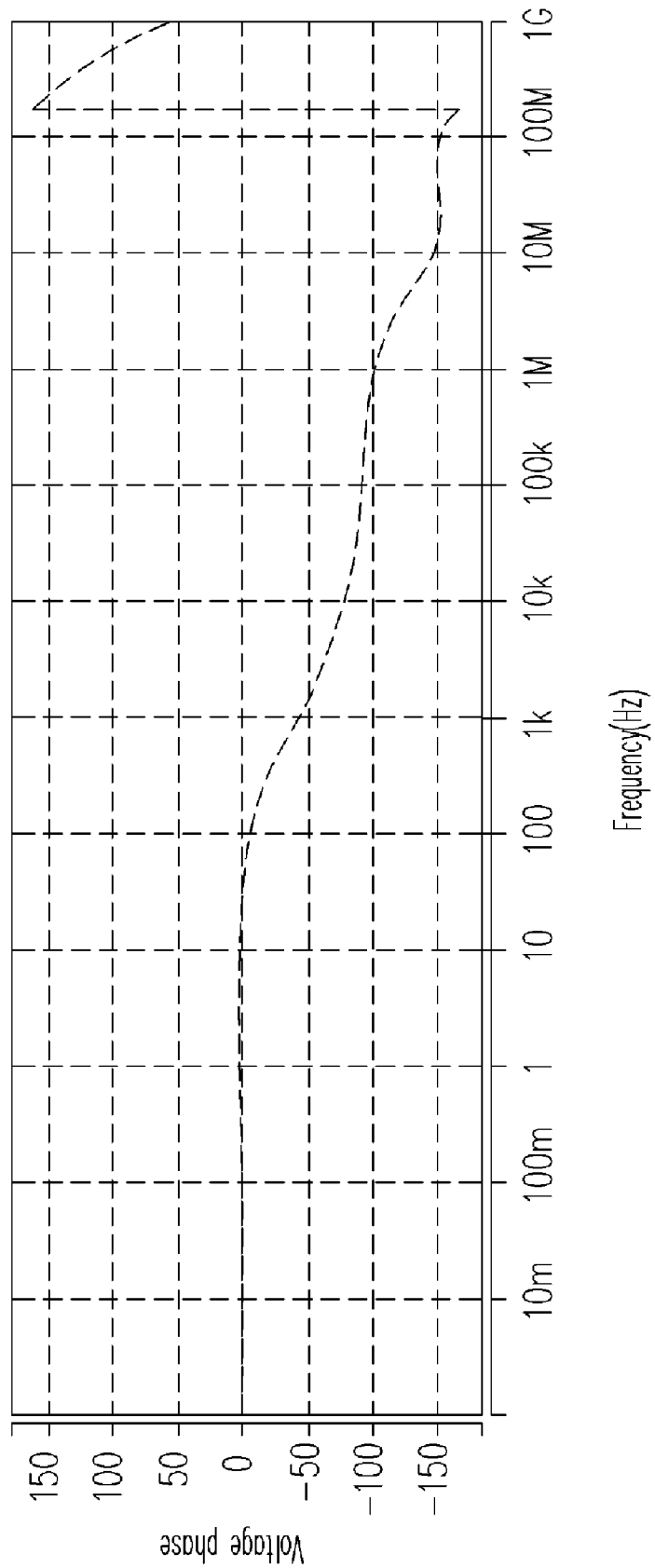

Referring to FIGS. 3A and 3B, the DC gain is equal to 61.7 dB. The whole frequency bandwidth of the gain is about 2.36 MHz, and the phase margin is about 73 degrees. The first-port frequency is about 2.06 kHz, and the second-port frequency is about 9.75 MHz. The first-port frequency of the present invention is similar to that without the compensation circuit. By adding the compensation circuit, the phase margin increases from 37 degrees to 73 degrees.

Figure 4A:
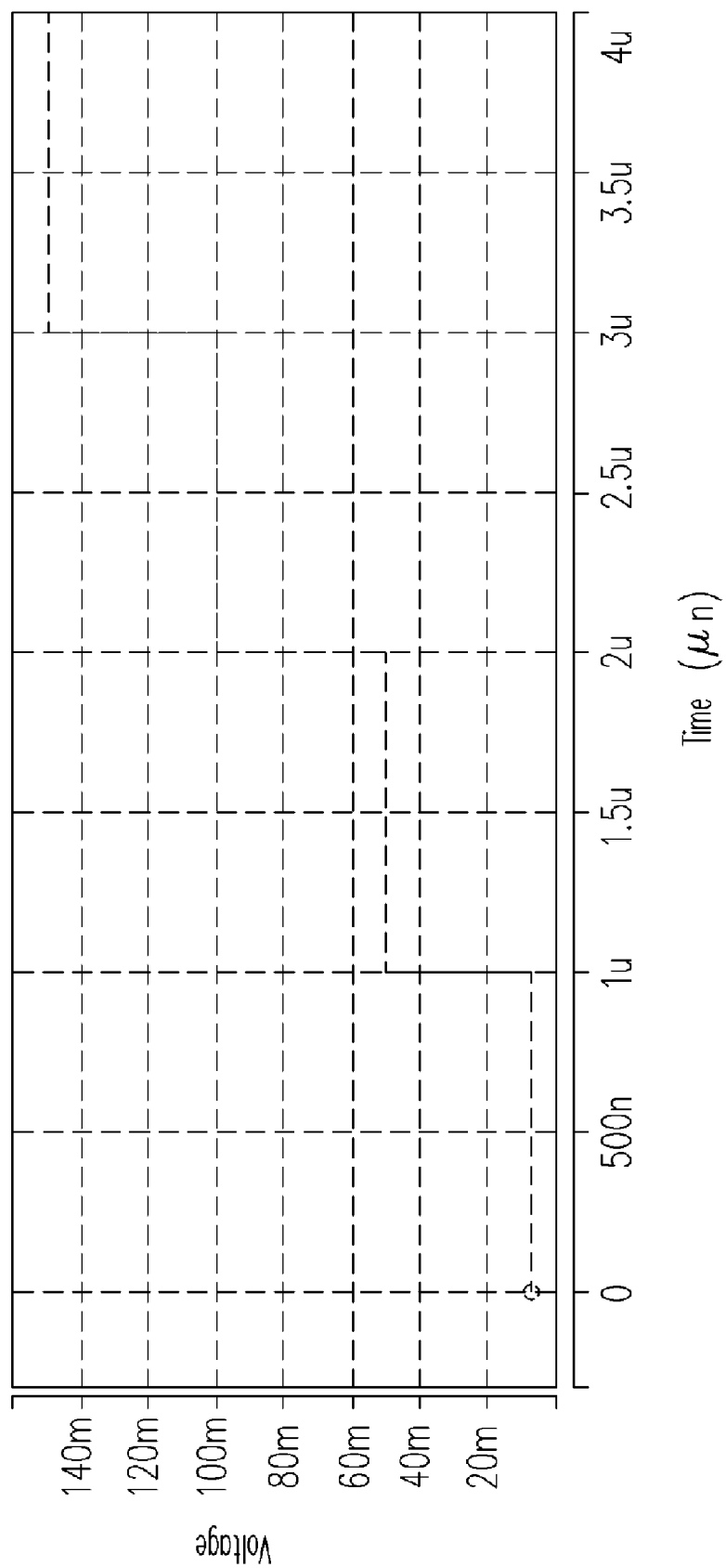
Figure 4B:
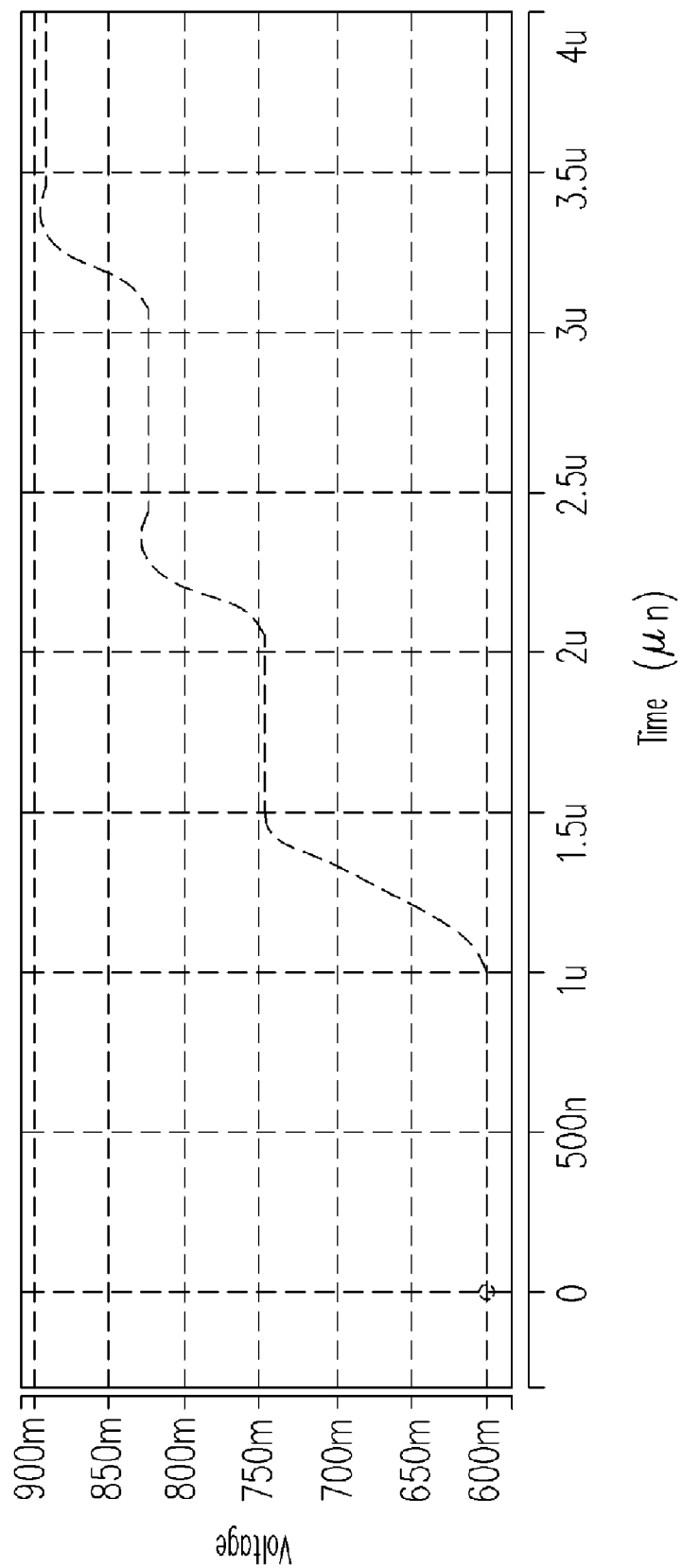
Figure 5:
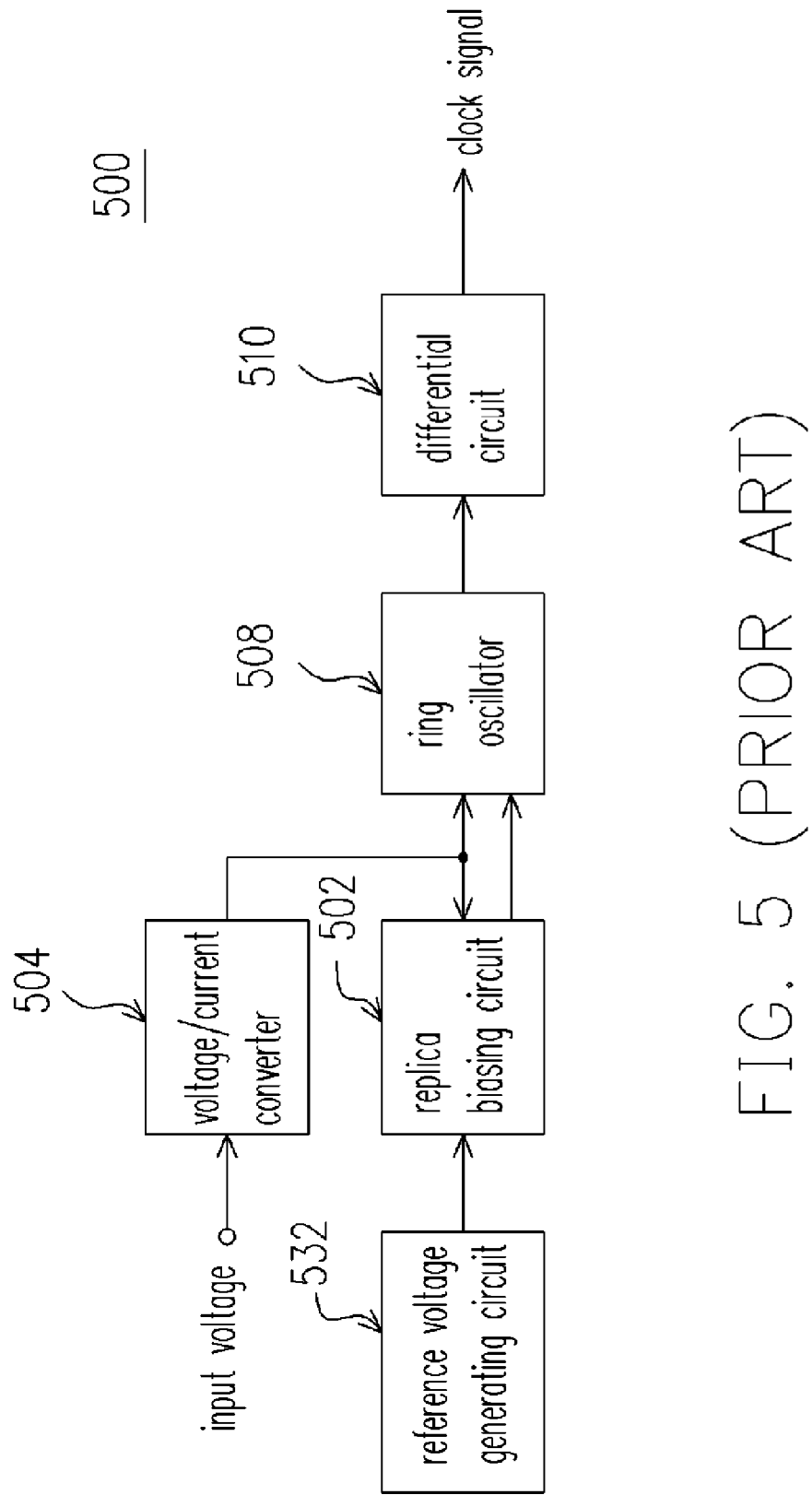
FIG. 5 is a circuit block diagram showing a prior art VCO.
Figure 6:
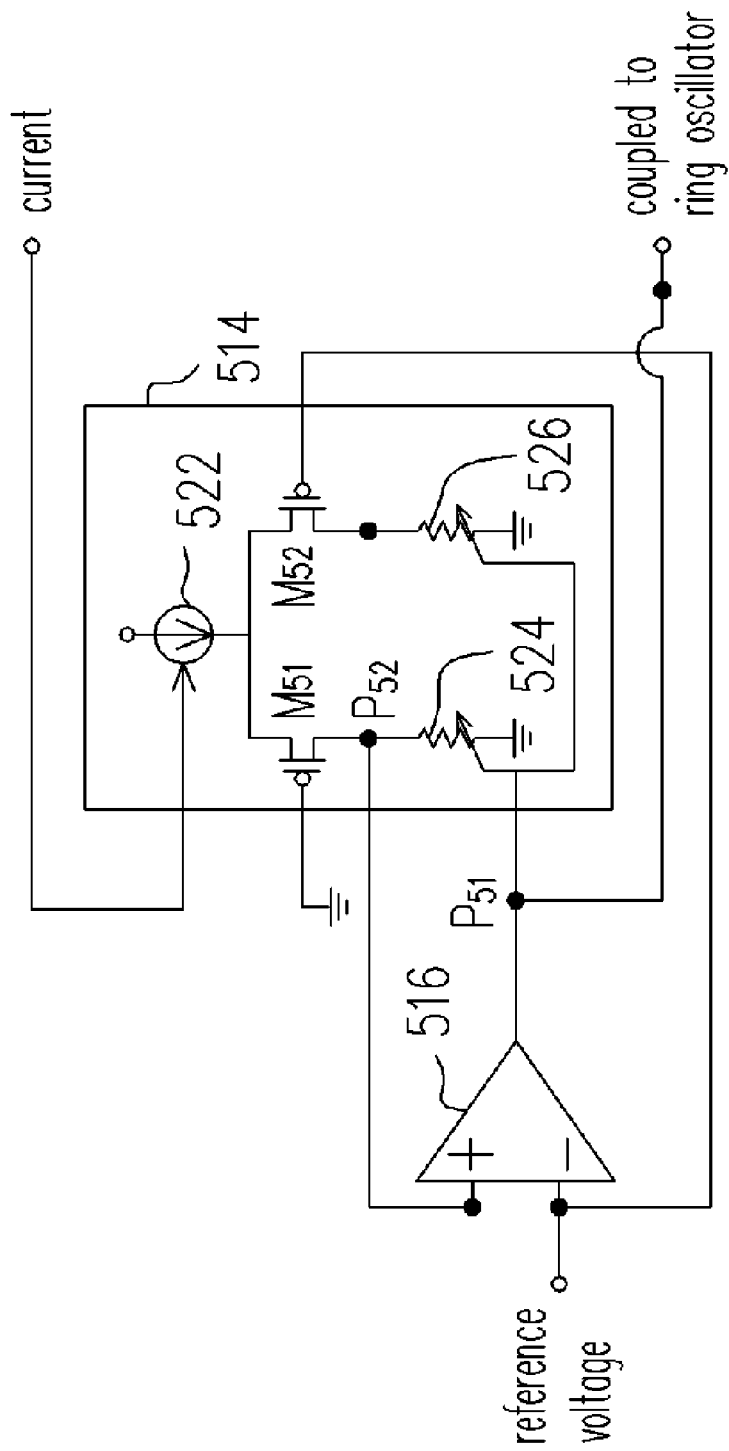
FIG. 6 is a schematic drawing showing a prior art VCO.
Figure 7A:
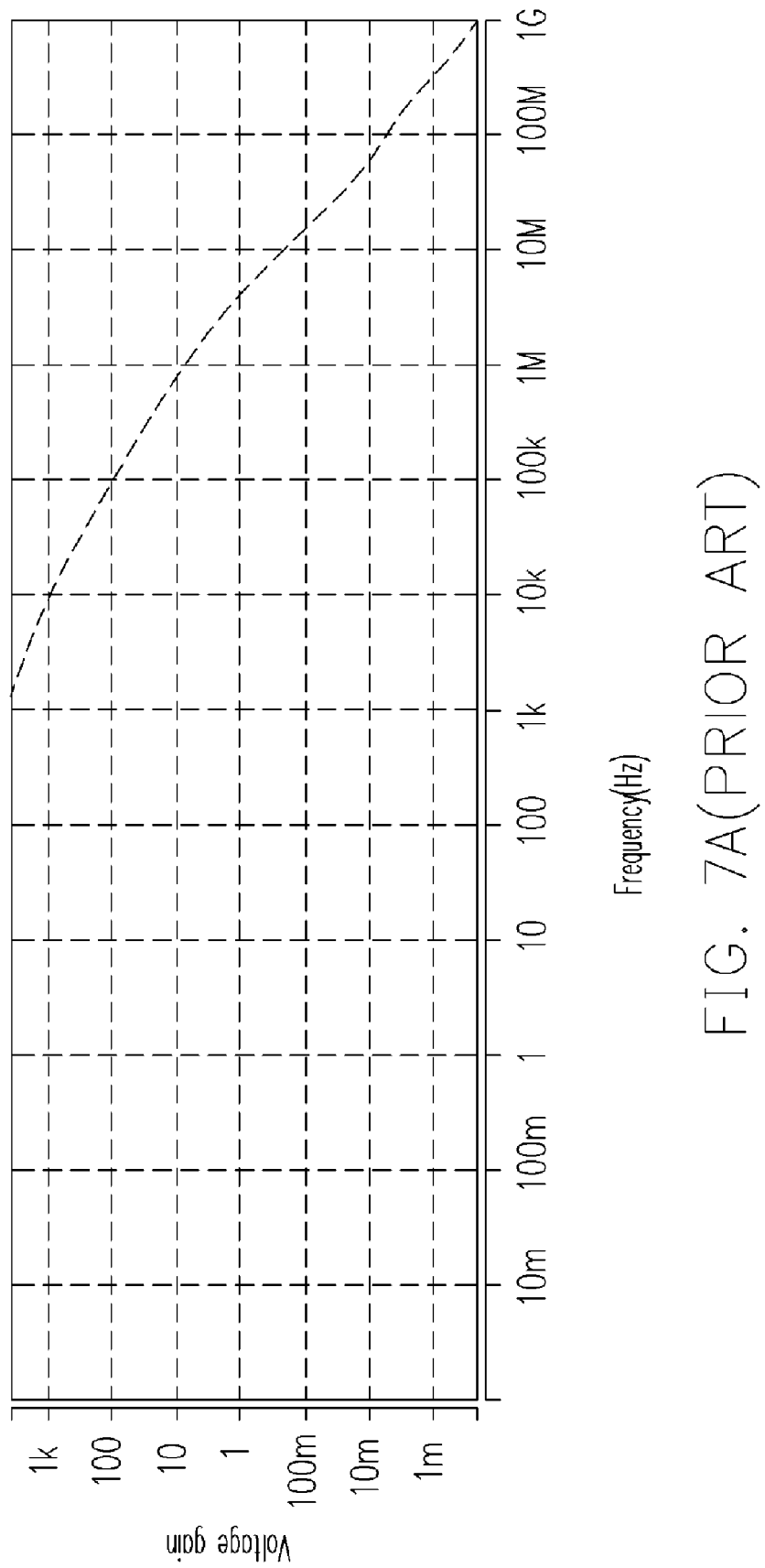
FIGS. 7A and 7B are small-signal analysis curves of the prior art replica biasing circuit.
Figure 7B:
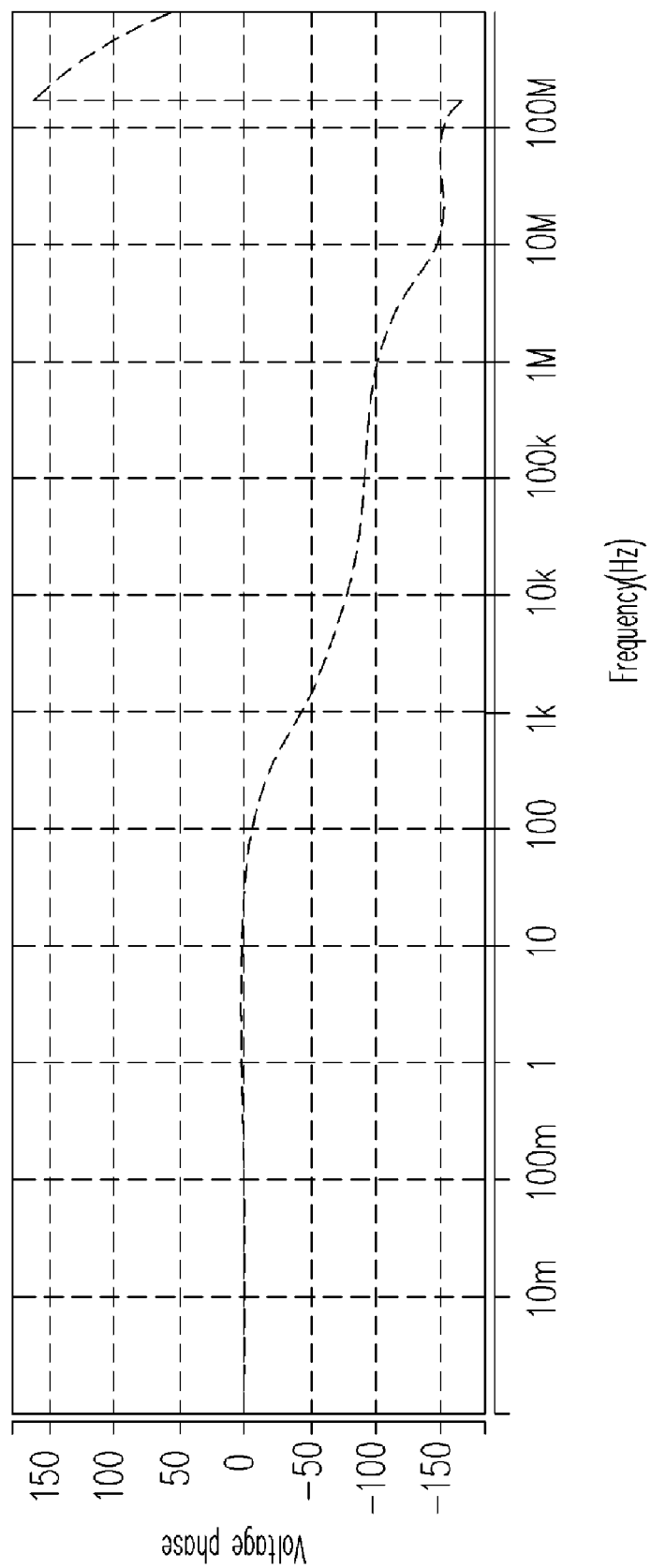
Figure 8A:
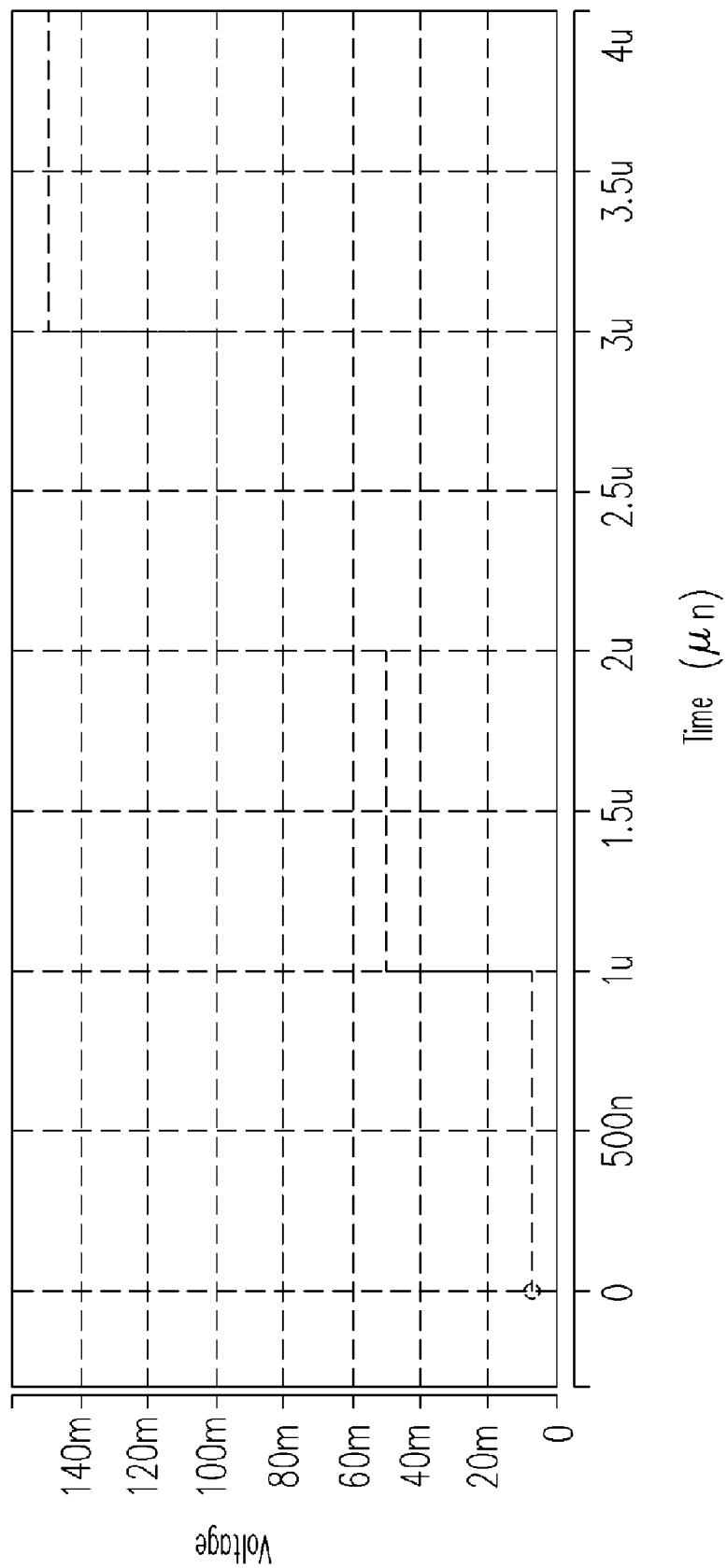
FIG. 8A is a conventional input voltage curve of a voltage control oscillator.
Figure 8B:
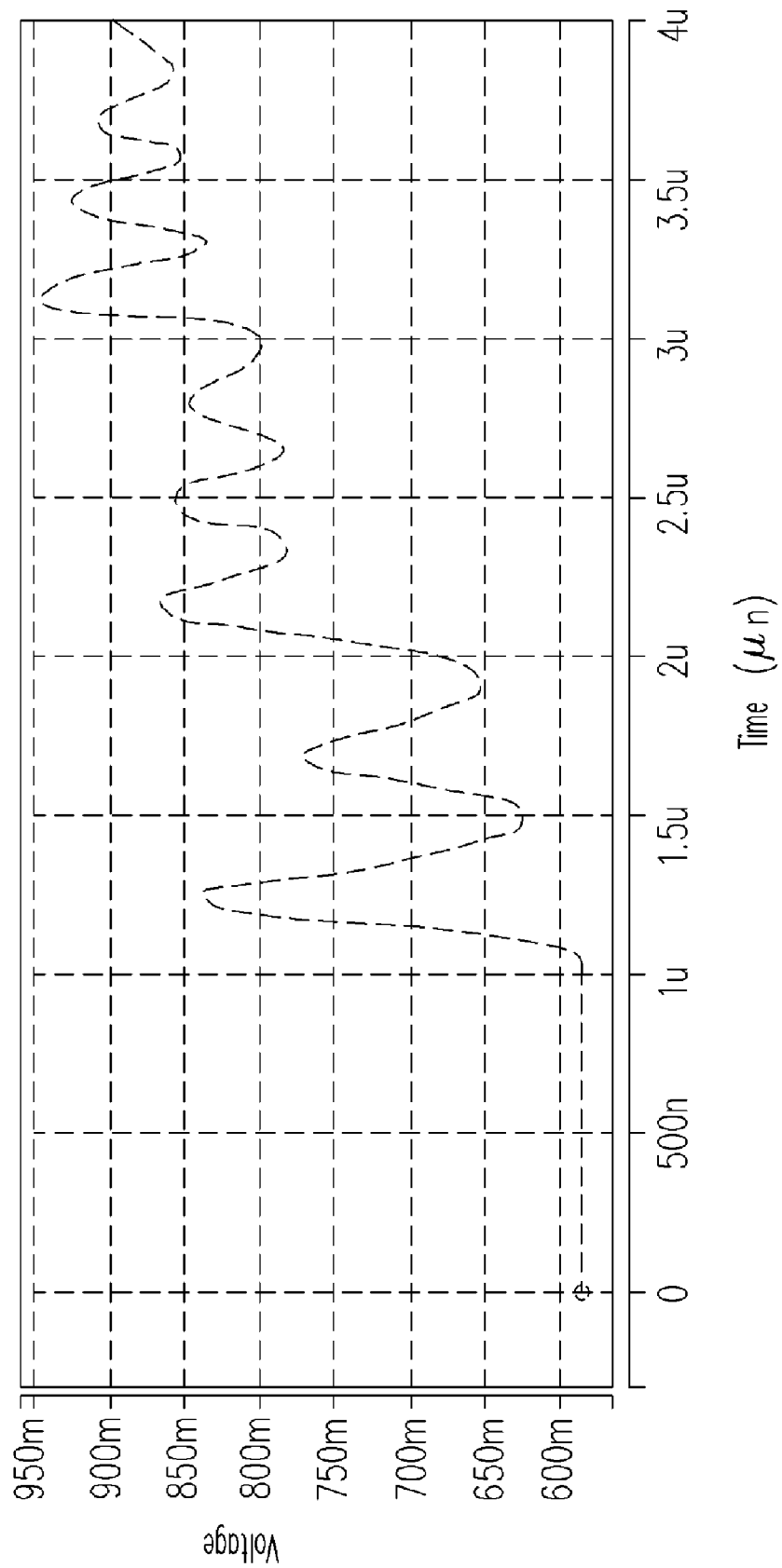
FIG. 8B is a conventional replica biasing circuit output voltage curve.

FIGS. 4A and 4B show the curves of a phase lock loop with the compensation circuit. FIG. 4A represents the input voltage curve at the input terminal of the voltage control oscillator 100. FIG. 4B represents the output at the port 23 of the biasing circuit 102. These curves show the output of the biasing circuit is stable.

Accordingly, the biasing circuit and the voltage control oscillator thereof stabilizes the output of the biasing circuit while the biasing circuit is being operated by low currents or low frequencies. Thus, the jitter of the output clock signal of the voltage control oscillator can be suppressed.

Although the present invention has been described in terms of exemplary embodiments, it is not limited thereto. Rather, the appended claims should be constructed broadly to include other variants and embodiments of the invention, which may be made by those skilled in the field of this art without departing from the scope and range of equivalents of the invention.

What is claimed is:

1. A biasing circuit receiving an input current and a reference voltage, the biasing circuit, comprising:
   a delay circuit, having a first input terminal, a second input terminal, a third input terminal, a fourth input terminal, an output terminal, wherein the first input terminal is adapted for receiving the input current, the second input terminal is grounded, the third input terminal is adapted for receiving the reference voltage;
   a compensation circuit, coupled to the output terminal of the delay circuit, for outputting a compensation voltage according to a differential voltage at the output terminal of the delay circuit; and
   a comparison circuit, having a first input terminal, a second input terminal and an output terminal, the first input terminal of the comparison circuit coupled to a node between the compensation circuit and the output terminal of the delay circuit to receive the compensation voltage, the second input terminal of the comparison circuit receiving the reference voltage, the comparison circuit comparing the compensation voltage and the reference voltage to output a comparison signal from the output terminal of the comparison circuit to the fourth input terminal of the delay circuit, wherein the delay circuit outputs the differential voltage from the output terminal of the delay circuit according to the input current and the comparison signal.

2. The biasing circuit of claim 1, wherein the compensation circuit comprises:
   a constant current source, having a first terminal and a second terminal, wherein the second terminal is adapted for outputting a constant current; and
   a voltage detecting circuit, coupled to the second terminal of the constant current source, for generating the compensation voltage according to the constant current, wherein the output terminal of the delay circuit is coupled a node between the constant current source and the voltage detecting circuit.

3. The biasing circuit of claim 2, wherein the voltage detecting circuit comprises a resistor.

4. The biasing circuit of claim 1, wherein the delay circuit comprises:
   a variable current source, for receiving the input current and outputting a variable current from a current output terminal of the variable current source;
   a first transistor, having a drain terminal, a source terminal and a gate terminal, wherein the source terminal is coupled to the current output terminal of the variable current source and the gate terminal of the first transistor is grounded;
   a first resistor circuit, having a first terminal, a second terminal and a third terminal, wherein the first terminal is coupled to the drain terminal of the first transistor, the second terminal is grounded and the third terminal is coupled to the output terminal of the comparison circuit;
   a second transistor, having a source terminal, a drain terminal and a gate terminal, wherein the source terminal is coupled to the current output terminal of the variable current source and the gate terminal of the second transistor is coupled to the third input terminal of the delay circuit; and
   a second resistor circuit, having a first terminal, a second terminal and a third terminal, wherein the first terminal is coupled to the drain terminal, the second terminal is grounded, the third terminal is coupled to the output terminal of the comparison circuit, and wherein the output terminal of the delay circuit is disposed between the first transistor and the first resistor circuit.

5. The biasing circuit of claim 4, wherein the first resistor circuit comprises a transistor.

6. The biasing circuit of claim 4, wherein the second resistor circuit comprises a transistor.

7. The biasing circuit of claim 1, wherein the reference voltage is generated from a reference voltage generating circuit.

8. A voltage control oscillator receiving an input voltage and a reference voltage, the voltage control oscillator comprising:
   a voltage/current converter, for receiving and converting the input voltage into an input current and outputting the input current;
   a biasing circuit, coupled to the voltage/current converter, the biasing circuit comprising:
      a delay circuit, having a first input terminal, a second input terminal, a third input terminal, a fourth input terminal, an output terminal, wherein the first input terminal is adapted for receiving the input current, the second input terminal is grounded and the third input terminal is adapted for receiving the reference voltage;
      a compensation circuit, coupled to the output terminal of the delay circuit, for outputting a compensation voltage according to a differential voltage at the output terminal of the delay circuit; and
      a comparison circuit, having a first input terminal, a second input terminal and an output terminal, wherein the first input terminal is coupled to a node between the compensation circuit and the output terminal of the delay circuit to receive the compensation voltage, the second input terminal of the comparison circuit is adapted for receiving the reference voltage, the comparison circuit is adapted for comparing the compensation voltage and the reference voltage to output a comparison signal from the output terminal of the comparison circuit to the fourth input terminal of the delay circuit; and
   an oscillation circuit, coupled to the voltage/current converter and the biasing circuit, for receiving the input current and the comparison signal from the comparison circuit, and outputting a clock signal.

9. The voltage control oscillator of claim 8, wherein the compensation circuit comprises:

a constant current source, having a first terminal and a second terminal, wherein the second terminal is adapted for outputting a constant current; and a voltage detecting circuit, coupled to the second terminal of the constant current source, for generating the compensation voltage according to the constant current, wherein the output terminal of the delay circuit is coupled between the constant current source and the voltage detecting circuit.

10. The voltage control oscillator of claim 9, wherein the voltage detecting circuit comprises a resistor.

11. The voltage control oscillator of claim 8, wherein the delay circuit comprises:

a variable current source, for receiving the input current and outputting a variable current from a current output terminal of the variable current source;

a first transistor, having a drain terminal, a source terminal and a gate terminal, wherein the source terminal is coupled to the current output terminal of the variable current source and the gate terminal is grounded;

a first resistor circuit, having a first terminal, a second terminal and a third terminal, wherein the first terminal is coupled to the drain terminal of the first transistor, the second terminal is grounded and the third terminal is coupled to the output terminal of the comparison circuit;

a second transistor, having a source terminal, a drain terminal and a gate terminal, wherein the source terminal is coupled to the current output terminal of the variable current source and the gate terminal is coupled to the third input terminal of the delay circuit; and a second resistor circuit, having a first terminal, a second terminal and a third terminal, wherein the first terminal is coupled to the drain terminal of the second transistor, the second terminal is grounded and the third terminal is coupled to the output terminal of the comparison circuit, and wherein the output terminal of the delay circuit is disposed between the first transistor and the first resistor circuit.

12. The voltage control oscillator of claim 11, wherein the first resistor circuit comprises a transistor.

13. The voltage control oscillator of claim 11, wherein the second resistor circuit comprises a transistor.

14. The voltage control oscillator of claim 8, the oscillation circuit comprises a plurality of delay circuits and a differential circuit.

15. The voltage control oscillator of claim 8, wherein the reference voltage is generated from a reference voltage generating circuit.

16. An electronic device comprising at least one biasing circuit, the biasing circuit comprising:

a delay circuit, having a first input terminal, a second input terminal, a third input terminal, and a fourth input terminal, an output terminal, wherein the first input terminal is adapted for receiving an input current, the second input terminal is grounded and the third input terminal is adapted for receiving a reference voltage;

a compensation circuit, coupled to the output terminal of the delay circuit, for outputting a compensation voltage according to a differential voltage at the output terminal of the delay circuit; and a comparison circuit, having a first input terminal, a second input terminal and an output terminal, wherein the first input terminal is coupled to a node between the compensation circuit and the output terminal of the delay circuit to receive the compensation voltage, the second input terminal is adapted for receiving the reference voltage, the comparison circuit is adapted for comparing the compensation voltage and the reference voltage to output a comparison signal from the output terminal of the comparison circuit to the fourth input terminal of the delay circuit.

17. The electronic device of claim 16, wherein the compensation circuit comprises:

a constant current source, having a first terminal and a second terminal, wherein the second terminal is adapted for outputting a constant current; and a voltage detecting circuit, coupled to the second terminal of the constant current source, for generating the compensation voltage according to the constant current, wherein the output terminal of the delay circuit is coupled to a node between the constant current source and the voltage detecting circuit.

18. An electronic device comprising at least one voltage control oscillator, the voltage control oscillator circuit receiving an input voltage and a reference voltage and comprising:

a voltage/current converter, for receiving and converting the input voltage into an input current and outputting the input current;

a biasing circuit, coupled to the voltage/current converter, the biasing circuit comprising:

a delay circuit, having a first input terminal, a second input terminal, a third input terminal, a fourth input terminal, an output terminal, wherein the first input terminal is adapted for receiving the input current, the second input terminal is grounded, the third input terminal is adapted for receiving the reference voltage;

a compensation circuit, coupled to the output terminal of the delay circuit, for outputting a compensation voltage according to a differential voltage at the output terminal of the delay circuit; and a comparison circuit, having a first input terminal, a second input terminal and an output terminal, wherein the first input terminal is coupled to a node between the compensation circuit and the output terminal of the delay circuit to receive the compensation voltage, the second input terminal is adapted for receiving the reference voltage, the comparison circuit is adapted for comparing the compensation voltage and the reference voltage to output a comparison signal from the output terminal of the comparison circuit to the fourth input terminal of the delay circuit; and an oscillation circuit, coupled to the voltage/current converter and the biasing circuit, for receiving the input current and the comparison signal from the comparison circuit, and outputting a clock signal.

* * * * *